(12) United States Patent
Wang et al.

(10) Patent No.: US 10,411,651 B2
(45) Date of Patent: Sep. 10, 2019

(54) HIGH-EFFICIENCY AMPLIFYING DEVICE AND METHOD FOR CONTROLLING POWER SUPPLY THEREOF

(71) Applicant: Chengdu University of Information technology, Chengdu, Sichuan (CN)

(72) Inventors: Haishi Wang, Sichuan (CN); Yingxiang Li, Sichuan (CN); Jiang Du, Sichuan (CN); Yan Yang, Sichuan (CN); Tianbao Wang, Sichuan (CN); Zhan Wen, Sichuan (CN); Xin Zheng, Sichuan (CN); Jie Sun, Sichuan (CN); Yu Zhang, Sichuan (CN); Junjie Yang, Sichuan (CN)

(73) Assignee: Chengdu University of Information technology, Chengdu, Sichuan (CN)

( * ) Notice: Subject to any disclaimer, the term of this patent is extended or adjusted under 35 U.S.C. 154(b) by 0 days.

(21) Appl. No.: 15/953,190

(22) Filed: Apr. 13, 2018

(65) Prior Publication Data
US 2018/0234054 A1 Aug. 16, 2018

(30) Foreign Application Priority Data

Apr. 13, 2017 (CN) .......................... 2017 1 0238938
Apr. 13, 2017 (CN) .......................... 2017 1 0238977

(51) Int. Cl.
| *H03F 3/04* | (2006.01) |
| *H03F 1/02* | (2006.01) |
| *H03F 3/213* | (2006.01) |
| *H03F 3/187* | (2006.01) |
| *H03F 3/45* | (2006.01) |

(52) U.S. Cl.
CPC ........... *H03F 1/0216* (2013.01); *H03F 3/187* (2013.01); *H03F 3/213* (2013.01); *H03F 3/45475* (2013.01); *H03F 2200/03* (2013.01); *H03F 2200/21* (2013.01); *H03F 2200/78* (2013.01); *H03F 2203/45528* (2013.01); *H03F 2203/45596* (2013.01)

(58) Field of Classification Search
CPC .... H03F 1/0216; H03F 3/45475; H03F 3/187; H03F 3/213; H03F 2203/45596; H03F 2203/45528; H03F 2200/78; H03F 2200/03; H03F 2200/21; H03F 1/0244; H03F 1/0211; H03F 2200/504; H03F 1/0227; H03G 3/3042; H03G 3/004; H03G 3/3047; H03G 3/3036
USPC ................................ 330/127, 129, 136, 297
See application file for complete search history.

(56) References Cited

U.S. PATENT DOCUMENTS

| 7,880,548 B2 | 2/2011 | Ye et al. |
| 8,605,915 B2 | 12/2013 | Wang et al. |
| 2011/0095829 A1 | 4/2011 | Ye et al. |
| 2011/0221533 A1* | 9/2011 | Lesso .................... H03F 1/0227 330/297 |

(Continued)

*Primary Examiner* — Khanh V Nguyen

(57) ABSTRACT

An amplifying device includes a power amplifying unit, a power supply unit for providing the power amplifying unit with a positive power supply and a negative power supply, and a mode control unit for controlling a working mode of the power supply unit. The positive power supply and the negative power supply of the amplifying device are able to vary with an output signal thereof, which reduces the power consumption of the outputted transistors of the amplifying device, thereby improving the efficiency of the amplifying device.

18 Claims, 6 Drawing Sheets

(56) References Cited

U.S. PATENT DOCUMENTS

2014/0169588 A1* 6/2014 Petersen ............... H03F 3/68
  381/120
2016/0056777 A1* 2/2016 Thandri ............... H03F 1/0227
  330/251

* cited by examiner

HIGH-EFFICIENCY AMPLIFYING DEVICE AND METHOD FOR CONTROLLING POWER SUPPLY THEREOF

CROSS REFERENCE OF RELATED APPLICATION

The present invention claims priority under 35 U.S.C. 119(a-d) to CN 201710238938.0, filed Apr. 13, 2017 and CN 201710238977.0, filed Apr. 13, 2017.

BACKGROUND OF THE PRESENT INVENTION

Field of Invention

The present invention relates to the amplifying device, and more particularly to a high-efficiency amplifying device and a method for controlling power supply thereof.

Description of Related Arts

Amplifiers play an important role in analog-to-digital conversion circuits and power integrated circuits. One of the important functions of the amplifiers is to amplify audio signals as an audio amplifier. The Peak Average Ratio (PAR) of speech or music signals is relatively large, the peak voltage is much larger than the average voltage, and the amplitude is usually subject to Gaussian distribution, that is, the transient voltage amplitude of the audio signal during most of the time is far below the peak voltage amplitude thereof. In order to avoid clipping distortion, the power supply voltage of the amplifier must be large enough to handle most of the audio signals. With this power supply voltage, when the amplifier processes a low-amplitude audio signal, the energy is lost to the output transistor, which not only reduces the efficiency of the amplifier but also brings the problem of heat dissipation. For example, for the amplifier 100 shown in FIG. 1, when the power supply voltage VCC is 5 V and the output signal VO is 1 V, the voltage drop on the output transistor Q1 will reach 4 V, i.e., 80% of the power supply voltage will be lost by the transistor P1 instead of applying to the speaker SPK for generating useful power. Considering the loss of other components of the amplifier, at this time, the transient efficiency of the amplifier is less than 20%. Experiments show that when the PAR of the input signal is 15 dB, the average efficiency is less than 20%. How to improve the efficiency of the amplifier is a problem faced by those skilled in the art.

SUMMARY OF THE PRESENT INVENTION

Aiming at deficiencies of the prior art, the prior art provides a high-efficiency amplifying device, which comprises:

a power amplifying unit which has a first input terminal, a second input terminal, an output terminal, a first power terminal and a second power terminal, wherein the first power terminal is adapted for receiving a positive power supply, the second power terminal is adapted for receiving a negative power supply, the output terminal is adapted for receiving a drive signal;

a power supply unit which has a control terminal, a first output terminal for providing the positive power supply and a second output terminal for providing the negative power supply, wherein the first output terminal of the power supply unit is connected with the first power terminal of the power amplifying unit, the second output terminal of the power supply unit is connected with the second power terminal of the power amplifying unit; and a mode control unit which has a first sampling terminal, a second sampling terminal, a third sampling terminal and an output terminal, wherein the first sampling terminal is connected with the first output terminal of the power supply unit, the second sampling terminal is connected with the second output terminal of the power supply unit, the third sampling terminal is connected with one of the first input terminal, the second input terminal and the output terminal of the power amplifying unit, the output terminal of the mode control unit is connected with the control terminal of the power supply unit, the mode control unit controls a working mode of the power supply unit based on the drive signal and an output voltage of the power supply unit, wherein:

if the power supply unit works in a first working mode, the positive power supply and the negative power supply respectively have a first positive voltage and a first negative voltage;

if the power supply unit works in a second positive working mode, the positive power supply and the negative power supply respectively have a second positive voltage and the first negative voltage;

if the power supply unit works in a second negative working mode, the positive power supply and the negative power supply respectively have the first positive voltage and a second negative voltage;

if the power supply unit works in a third positive working mode, the positive power supply and the negative supply respectively have a third positive voltage and the first negative voltage;

if the power supply unit works in a third negative working mode, the positive power supply and the negative supply respectively have the first positive voltage and a third negative voltage;

the third positive voltage is larger than the second positive voltage, the second positive voltage is larger than the first positive voltage, the third negative voltage is larger than the second negative voltage, the second negative voltage is larger than the first negative voltage;

if the power supply unit works in a first positive sleep mode, the power supply unit reduces or stops providing current for the first output terminal thereof;

if the power supply unit works in a second positive sleep mode, the power supply unit reduces or stops providing current for the first output terminal thereof;

if the power supply unit works in a first negative sleep mode, the power supply unit reduces or stops providing current for the second output terminal thereof;

if the power supply unit works in a second negative sleep mode, the power supply unit reduces or stops providing current for the second output terminal thereof.

Preferably, the power amplifying unit comprises:

a first amplifier which has a first input terminal, a second input terminal, an output terminal, a first power terminal and a second power terminal, wherein the first power terminal of the first amplifier is adapted for receiving the positive power supply, the second power terminal of the first amplifier is adapted for receiving the negative power supply, the output terminal of the first amplifier is adapted for providing the drive signal;

a first resistor which has a first terminal and a second terminal, wherein the first terminal of the first resistor is connected with the first input terminal of the power amplifying unit, the second terminal of the first resistor is connected with the first input terminal of the first amplifier;

a second resistor which has a first terminal and a second terminal, wherein the first terminal of the second resistor is connected with the second input terminal of the power amplifying unit, the second terminal of the second resistor is connected with the second input terminal of the first amplifier;

a third resistor which has a first terminal and a second terminal, wherein the first terminal of the third resistor is connected with the first input terminal of the first amplifier, the second terminal of the third resistor is connected with ground; and a fourth resistor which has a first terminal and a second terminal, wherein the first terminal of the fourth resistor is connected with the second input terminal of the first amplifier, the second terminal of the fourth resistor is connected with the output terminal of the power amplifying unit;

a ratio of a resistance of the first resistor to a resistance of the third resistor is equal to a ratio of a resistance of the second resistor to a resistance of the fourth resistor.

Also, the present invention provides a method for controlling a power supply unit of an amplifying device, wherein a power amplifying unit is adapted for receiving an input signal and providing a drive signal at an output terminal thereof, the power supply unit is adapted for providing a positive power supply and a negative power supply for the power amplifying unit, the method comprises steps of:

if the input signal of the power amplifying unit is zero, the power supply unit working in a first working mode, wherein the positive power supply has a first positive voltage, the negative power supply has a first negative voltage;

if the power supply unit works in the first working mode, when the drive signal increases to a first positive number, or the drive signal increases till a voltage difference between the drive signal and the positive power supply is a first positive threshold, the power supply unit switching to a second positive working mode, wherein the positive power supply has a second positive voltage, the negative power supply has the first negative voltage;

if the power supply unit works in the second positive working mode, when the drive signal increases to a second positive number, or the drive signal increases till the voltage difference between the drive signal and the positive power supply is a fourth positive threshold, the power supply unit switching to a third positive working mode, wherein the positive power supply has a third positive voltage, the negative power supply has the first negative voltage; when the drive signal decreases, the drive signal of the power amplifying unit decreases to a second positive threshold, the power supply unit switching to a first positive sleep mode;

if the power supply unit works in a third positive working mode, when the drive signal of the power amplifying unit decreases to a fifth positive threshold, the power supply unit switching to a second positive sleep mode;

if the power supply unit works in the second positive sleep mode, when the positive power supply decreases to a sixth positive threshold, if the drive signal is smaller than the second positive threshold, the power supply unit switching to the first positive sleep mode; if the drive signal is larger than the second positive threshold, the power supply unit switching to the second positive working mode; and if the power supply unit works in the first positive sleep mode, when the positive power supply decreases to a second positive threshold, the power supply unit switching to the first working mode;

wherein the third positive voltage is larger than the second positive voltage, the second positive voltage is larger than the first positive voltage, the fifth positive threshold is larger than the second positive threshold, the sixth positive threshold is larger than the third positive threshold.

The positive power supply and the negative power supply of the amplifying device provided by the present invention are able to vary with an output signal thereof, which reduces the power consumption of the outputted transistors of the amplifying device, thereby improving the efficiency of the amplifying device.

DETAILED DESCRIPTION OF THE PREFERRED EMBODIMENT

The following specific embodiments are exemplary embodiments of the present invention and are merely illustrative in nature and not restrictive. In the following description, numerous specific details are set forth in order to provide a thorough understanding of the present invention. However, it will be apparent to one skilled in the art that these specific details are unnecessary for the present invention. In other examples, well-known circuits, materials, or methods have not been described in detail in order to avoid obscuring the present invention.

In the specification, "one example" or "examples" means that the particular feature, structure, or characteristic described in connection with the example is included in at least one example of the present invention. The term "in one example" in various places of the specification does not refer to the same example, or does not exclude other examples or alternative examples. All characteristics, steps in all methods or processes disclosed in this specification, may be combined in any manner other than mutually exclusive features and/or steps. Moreover, those skilled in the art will understand that the diagrams provided herein are illustrative and are not necessarily drawn to scale. It should be understood that when "an element is connected with another element", the element is directly connected with another element or connected with another element through an intermediate element. Conversely, when "an element is directly connected with another element", there is no intermediate element between the element and another element. The same reference sign represents the same element. An element is able to directly receive a signal or indirectly receive through switches, resistors, level shifters and signal processing units. The term "and/or" includes one and all combinations of one or more of the associated listed items.

Figure 1:
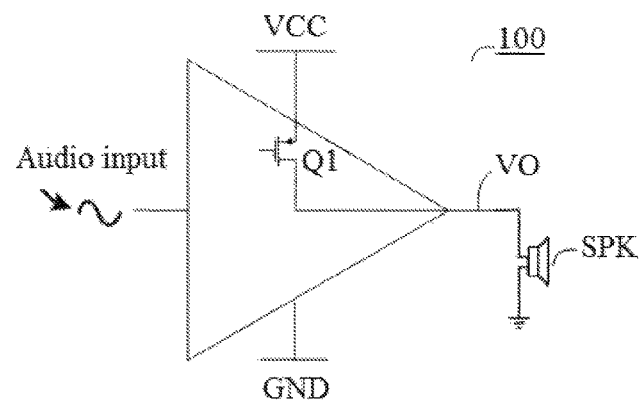
FIG. 1 is a circuit diagram of an existing amplifying device.
Figure 2:
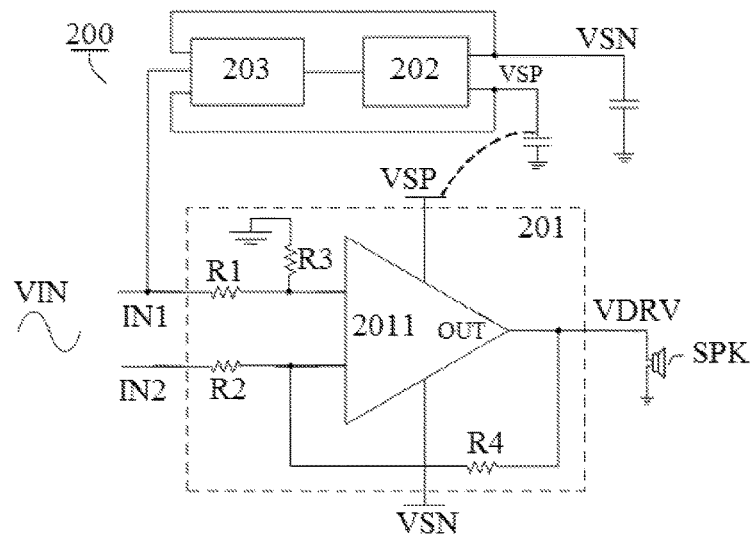
FIG. 2 is a circuit diagram of a high-efficiency amplifying device according to a preferred embodiment of the present invention.

FIG. 2 is a circuit diagram of a high-efficiency amplifying device 200 according to a preferred embodiment of the present invention, which comprises a power amplifying unit 201, a power supply unit 202 and a mode control unit 203. The power amplifying unit 201 is able to transform an input signal VIN which contains non-zero DC (direct current) components into a drive signal VDRV (which takes ground potential as a static working point) without the DC components for driving an occurrence device SPK. According to the preferred embodiment of the present invention, the power amplifying unit 201 has a first power terminal for receiving a positive power supply VSP, a second power terminal for receiving a negative power supply VSN, a first input terminal and a second input terminal both of which are adapted for receiving the input signal VIN, and an output terminal for providing the drive signal VDRV; the power amplifying unit 201 comprises a first amplifier 2011, a first resistor R1, a second resistor R2, a third resistor R3 and a fourth resistor R4. The first amplifier 2011 has a first input terminal, a second input terminal and an output terminal. The first resistor R1 has a first terminal and a second terminal, wherein the first terminal of the first resistor R1 is connected with the first input terminal IN1 of the power amplifying unit 201, the second terminal of the first resistor R1 is connected with the first input terminal of the first amplifier 2011. The second resistor R2 has a first terminal and a second terminal, wherein the first terminal of the second resistor R2 is connected with the second input terminal IN2 of the power amplifying unit 201, the second terminal of the second resistor R2 is connected with the second input terminal of the first amplifier 2011. The third resistor R3 has a first terminal and a second terminal, wherein the first terminal of the third resistor R3 is connected with the first input terminal of the first amplifier 2011, the second terminal of the third resistor R3 is connected with ground GND. The fourth resistor R4 has a first terminal and a second terminal, wherein the first terminal of the fourth resistor R4 is connected with the second input terminal of the first amplifier 2011, the second terminal of the fourth resistor R4 is connected with the output terminal OUT of the first amplifier 2011. A ratio of a resistance of the first resistor R1 to a resistance of the third resistor R3 is equal to a ratio of a resistance of the second resistor R2 to a resistance of the fourth resistor R4. Preferably, the resistance of the first resistor R1 is equal to the resistance of the second resistor R2, and the resistance of the third resistor R3 is equal to the resistance of the fourth resistor R4. More preferably, all of the first resistor R1, the second resistor R2, the third resistor R3 and the fourth resistor R4 have the same resistance.

Figure 3:
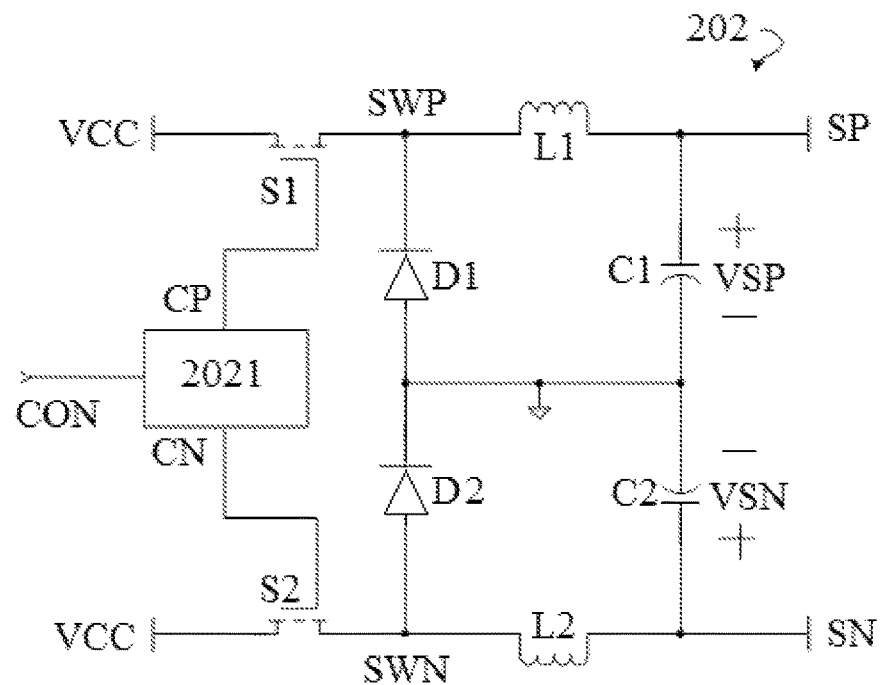
FIG. 3 is a circuit diagram of a power supply unit of the high-efficiency amplifying device according to the preferred embodiment of the present invention.

The power supply unit 202 has a control terminal, a first output terminal SP for providing the positive power supply VSP, and a second output terminal SN for providing the negative power supply VSN, wherein the first output terminal SP is connected with the first power terminal of the power amplifying unit 201, and the second output terminal SN is connected with the second power terminal of the power amplifying unit 201. FIG. 3 is a circuit diagram of the power supply unit 202 according to the preferred embodiment of the present invention, which comprises a first switch S1, a second switch S2, a first diode D1, a second diode D2, a first inductor L1, a second inductor L2, a first capacitor C1, a second capacitor C2 and a control logic unit 2021. The first switch S1 has a first terminal, a second terminal and a control terminal, wherein the first terminal of the first switch S1 is connected with an input power VCC, the second terminal of the first switch S1 is connected with a first switch terminal SWP. The second switch S2 has a first terminal, a second terminal and a control terminal, wherein the first terminal of the second switch S2 is connected with the input power VCC, the second terminal of the second switch S2 is connected with a second switch terminal SWN. The first diode D1 has a cathode and an anode, wherein the anode of the first diode D1 is connected with the ground GND, the cathode of the first diode D1 is connected with the first switch terminal SWP. The second diode D2 has a cathode and an anode, wherein the cathode of the second diode D2 is connected with the ground GND, the anode of the second diode D2 is connected with the second switch terminal SWN. The first inductor L1 has a first terminal and second terminal, wherein the first terminal of the first inductor L1 is connected with the first switch terminal SWP, the second terminal of the first inductor L1 is connected with the first output terminal SP. The second inductor L2 has a first terminal and a second terminal, wherein the first terminal of the second inductor L2 is connected with the second switch terminal SWN, the second terminal of the second inductor L2 is connected with the second output terminal SN. The first capacitor C1 has a first terminal and a second terminal, wherein the first terminal of the first capacitor C1 is connected with the first output terminal SP, the second terminal of the first capacitor C1 is connected with the ground GND. The second capacitor C2 has a first terminal and a second terminal, wherein the first terminal of the second capacitor C2 is connected with the second output terminal SN, the second terminal of the second capacitor C2 is connected with the ground GND. The first switch S1, the first diode D1, the first inductor L1 and the first capacitor C1 form a positive power supply circuit for providing the positive power supply VSP. The second switch S2, the second diode D2, the second inductor L2 and the second capacitor C2 form a negative power supply circuit for providing the negative power supply VSN. The control logic unit 2021 receives a control signal CON and provides a first control signal CP and a second control signal CN which are respectively adapted for controlling the positive power supply circuit and the negative power supply circuit. Preferably, the positive power supply VSP and the negative power supply VSN are able to be adjusted by changing a duty ratio of the first control signal CP and the second control signal CN, respectively. In FIG. 3, both of the first switch S1 and the second switch S2 are PMOS (positive channel metal-oxide-semiconductor) transistors, both of the first diode D1 and the second diode D2 are Schottky diodes. Moreover, both of the first diode D1 and the second diode D2 are able to be replaced by NMOS (negative channel metal-oxide-semiconductor) transistors.

The mode control unit 203 has a first sampling terminal, a second sampling terminal, a third sampling terminal and an output terminal, wherein the first sampling terminal of the mode control unit 203 is connected with the first output terminal SP of the power supply unit 202, the second sampling terminal of the mode control unit 203 is connected with the second output terminal SN of the power supply unit 202, the third sampling terminal of the mode control unit 203 is connected with the output terminal, or one of the first input terminal IN1 and the second input terminal IN2, or both of the first input terminal IN1 and the second input terminal IN2 of the power amplifying unit 201, so as to monitor an amplitude of the outputted drive signal VDRV of the power amplifying unit 201; the output terminal of the mode control unit 203 is connected with the control terminal of the power supply unit 202. Based on the input signals VIN1, VIN2, or/and VIN (VIN1−VIN2) of the power amplifying unit 201, and the output voltages VSP and/or VSN of the power supply unit 202, the mode control unit 203 controls a working mode of the power supply unit 202.

When the input signal VIN is equal to zero, the power supply unit 202 works in a standby mode, the positive power supply VSP and the negative power supply VSN respectively have a standby positive voltage VSP0 (such as 0.5 V) and a standby negative voltage VSN0 (such as −0.5 V). At this time, the power supply amplitude is small, and the voltage that is wasted on the output power tube of the first amplifier 2011 is the minimum, so that the static power consumption is minimized.

When the input signal VIN is small, the power supply unit 202 works in a first working mode, the positive power supply VSP and the negative power supply VSN respectively have a first positive voltage VSP1 (such as 0.9 V) and a first negative voltage VSN1 (such as −0.9 V). At this time, the power supply amplitude is small, and the voltage that is wasted on the output power tube of the first amplifier 2011 is small, so that the high-efficiency amplifying device 200 maintains the low power consumption. In an example of the present invention, the standby mode and the first working mode are the same mode, that is, the standby positive voltage VSP0 is equal to the first positive voltage VSP1, and the standby negative voltage VSN0 is equal to the first negative voltage VSN1.

When the power supply unit 202 works in a second positive working mode, the positive power supply VSP and the negative power supply VSN respectively have a second positive voltage VSP2 (such as 1.8 V) and the first negative voltage VSN1 (such as −0.9 V). With the drive signal VDRV increases, the positive power supply VSP also increases to prevent clipping distortion of the drive signal VDRV, and the negative power supply VSN still maintains the first negative voltage VSN1 to reduce the energy loss at the output transistor tube.

When the power supply unit 202 works in a second negative working mode, the positive power supply VSP and the negative power supply VSN respectively have the first positive voltage VSP1 (such as 0.9 V) and a second negative voltage VSN2 (such as −1.8 V). With the drive signal VDRV negatively increases, the negative power supply VSN also increases to prevent clipping distortion of the drive signal VDRV, and the positive power supply VSP still maintains the first positive voltage VSP1 to reduce the energy loss at the output transistor tube. In the description of the present invention, unless otherwise specified, the signal amplitude is compared based on the absolute value thereof. Moreover, with the input power supply or load current of the power supply unit 202 changes, the first positive voltage VSP1, the first negative voltage VSN1, the second positive voltage VSP2 and the second negative voltage VSN2 are hard to keep constant, and may fluctuate or change, which is without departing from the protection scope of the present invention.

Figure 4:
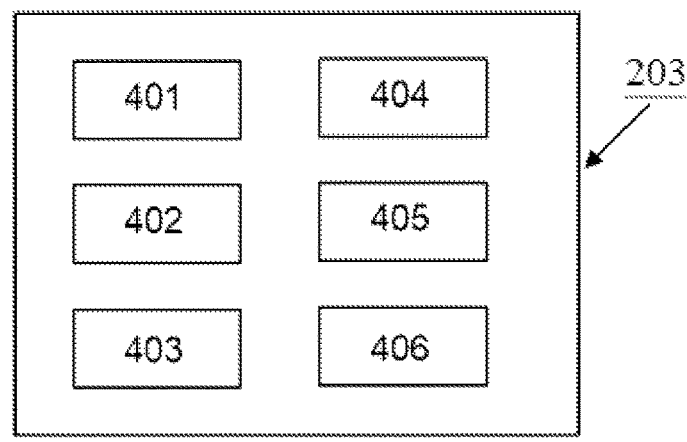
FIG. 4 is a block diagram of a mode control unit of the high-efficiency amplifying device according to the preferred embodiment of the present invention.
Figure 5:
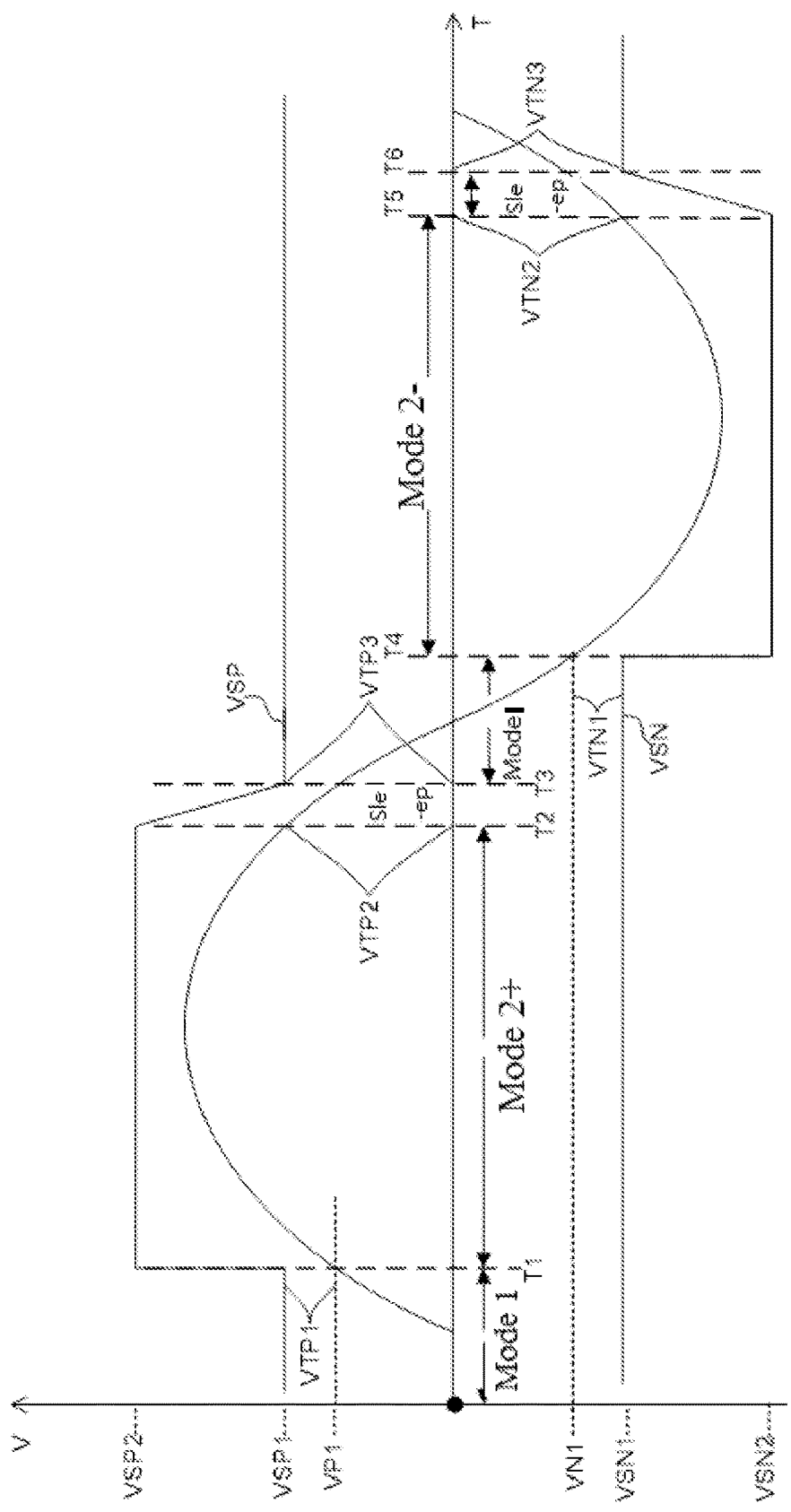
FIG. 5 is a working waveform diagram of the high-efficiency amplifying device according to the preferred embodiment of the present invention.

FIG. 4 is a block diagram of the mode control unit 203, which comprises a first monitor circuit 401, a second monitor circuit 402, a third monitor circuit 403, a fourth monitor circuit 404, a fifth monitor circuit 405 and a sixth monitor circuit 406. FIG. 5 shows a working waveform diagram when the mode control unit 203 in FIG. 4 is applied to the high-efficiency amplifying device 200.

When the drive signal VDRV is substantially small, the power supply unit 202 works in the first working mode (mode 1), and a first power terminal voltage thereof is VSP1. With the drive signal VDRV gradually increases, a voltage difference between the drive signal VDRV and the first positive voltage VSP1 is getting smaller and smaller. When the voltage difference between the positive power supply VSP (which is generally regarded as the first positive voltage VSP1 while ignoring changes caused by changing power supply and load current) and the drive signal VDRV is smaller than or equal to a first positive threshold VTP1 (at time T1), the first monitor circuit 401 controls the power supply unit 202 to switch to the second positive working mode (mode 2+), the first power terminal voltage of the power supply unit 202 quickly increases to the second positive voltage VSP2, so as to prevent the drive signal from being clipped and then distorted. The negative power supply VSN still remains the first negative voltage VSN1 to reduce power consumption. In some examples, the first positive voltage VSP1 of the power supply unit 202 is substantially constant and is unchanged with the inputted power supply of the power supply unit 202 (such as BUCK or BOOST which adopts closed-loop control). The first monitor circuit 401 is able to only monitor the amplitude of the drive signal VDRV without monitoring the voltage difference between the drive signal VDRV and the first positive voltage VSP1. The power supply unit 202 is able to directly switch to the second positively working mode based on the amplitude of the drive signal VDRV, that is, when the drive signal VDRV increases to a first positive number VP1, the first monitor circuit 401 controls the power supply unit 202 to switch to the second positively working mode.

When the power supply unit 202 works in the second positive working mode (mode 2+), the first power terminal voltage thereof is the second positive voltage VSP2. With the drive signal VDRV decreases, if the power amplifying unit 201 continuously uses the second positive voltage VSP2 which is so high, the energy waste is produced. Therefore, when the drive signal VDRV decreases to a second positive threshold VTP2 (at time T2), the second monitor circuit 402 controls the power supply unit 202 to switch out of the second positive working mode. In an example, the second positive threshold VTP2 is just equal to the first positive voltage VSP1. In another example, the second positive threshold VTP2 is larger than VSP1−VTP1 and smaller than VSP1. Of course, in other examples, the second positive threshold VTP2 is able to be smaller than or equal to VSP1−VTP1.

While being out of the second positive working mode, the power supply unit 202 switches to a first positive sleep mode instead of the first working mode. During the period of the first positive sleep mode, the power supply unit 202 stops or reduces the power supply for the capacitor (such as the first capacitor C1) which is connected with the first output terminal thereof. Due to the charge storage effect of the output capacitor, the first output terminal voltage of the power supply unit 202 gradually decreases from VSP2, when the positive power supply thereof decreases to a third positive threshold VTP3 (at time T3), the third monitor circuit 403 controls the power supply unit 202 to switch out of the first positive sleep mode and to the first working mode. The third positive threshold VTP3 is able to be equal to or not be equal to the second positive threshold VTP2. In an example, the third positive threshold VTP3 is just equal to the first positive voltage VSP1. In another example, the third positive threshold VTP3 is larger than VSP1−VTP1 and smaller than VSP1. Of course, in other examples, the third positive threshold VTP3 is smaller than or equal to VSP1-VTP1.

While working in the first working mode, the second power terminal voltage of the power supply unit 202 is VSN1. With the drive signal VDRV gradually negatively increases, a voltage difference between the drive signal VDRV and the first negative voltage VSN1 is getting smaller and smaller. When the voltage difference between the negative power supply VSN (which is generally regarded as the first negative voltage VSN1 while ignoring changes caused by changing power supply and load current) and the drive signal VDRV is smaller than a first negative threshold VTN1 (at time T4), the fourth monitor circuit 404 controls the power supply unit 202 to switch to a second negative working mode, the second power terminal voltage of the power supply unit 202 quickly increases to VSN2, so as to prevent the drive signal from being clipped and then distorted. The positive power supply VSP still remains the first positive voltage VSP1 to reduce power consumption. In some examples, the first negative voltage VSN1 of the power supply unit 202 is substantially constant and is unchanged with the inputted power supply of the power supply unit 202 (such as BUCK which adopts closed-loop control). The first monitor unit 401 is able to only monitor the amplitude of the drive signal VDRV without monitoring the voltage difference between the drive signal VDRV and the first negative voltage VSN1. The power supply unit 202 is able to directly switch to the second negative working mode based on the amplitude of the drive signal VDRV, that is, when the drive signal VDRV increases to a first negative number VN1, the first monitor circuit 401 controls the power supply unit 202 to switch to the second negative working mode.

While working in the second negative working mode, the first power terminal voltage of the power supply unit 202 is VSN2. With the drive signal VDRV decreases, if the power amplifying unit 201 continuously uses the second negative voltage VSN2 which is so high, the energy waste is produced. Therefore, when the drive signal VDRV decreases to a second negative threshold VTN2 (at time T5), the fifth monitor circuit 405 controls the power supply unit 202 to switch out of the second negative working mode. In an example, the second negative threshold VTN2 is just equal to the first negative voltage VSN1. In another example, the second negative threshold VTN2 is larger than VSN1-VTN1 and smaller than VSN1. Of course, in other examples, the second negative threshold VTN2 is smaller than or equal to VSN1-VTN1.

While being out of the second negative working mode, the power supply unit 202 switches to a first negative sleep mode instead of the first working mode. During the period of the first negative sleep mode, the power supply unit 202 stops or reduces power supply for the capacitor (such as the second capacitor C2) which is connected with the second output terminal thereof. Due to the charge storage effect of the output capacitor, the second output terminal voltage of the power supply unit 202 gradually decreases from VSN2 (close to the ground potential), when the negative power supply thereof decreases to a third negative threshold VTN3 (at time T6), the power supply unit 202 switches out of the first negative sleep mode and to the first working mode. The third negative threshold VTN3 is able to be equal to or not be equal to the second negative threshold VTN2. In one example, the third negative threshold VTN3 is just equal to the first negative voltage VSN1. In another example, the third negative threshold VTN3 is larger than VSN1-VTN1 and smaller than VSN1. In other examples, the third negative threshold VTN3 is smaller than or equal to VSN1-VTN1.

Figure 6:
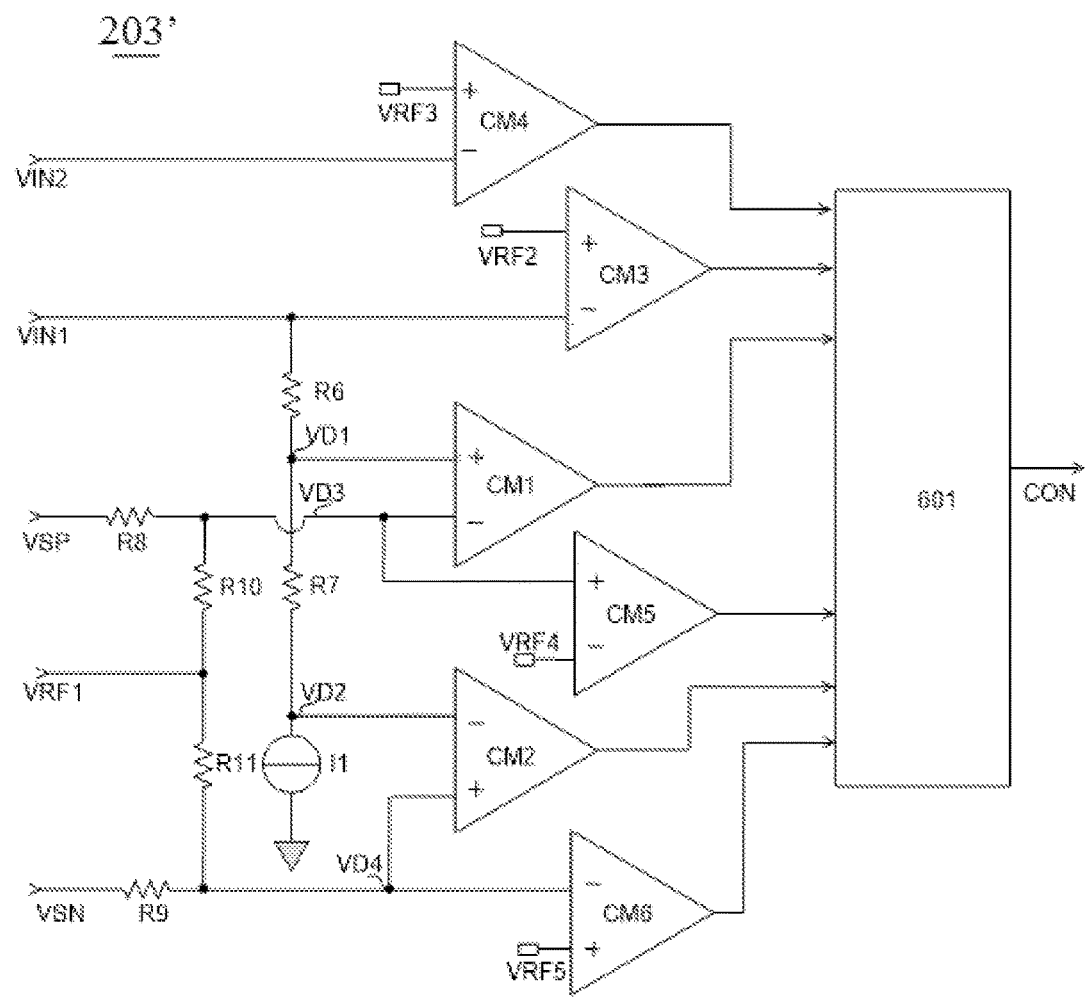
FIG. 6 is a specific circuit diagram of the mode control unit of the high-efficiency amplifying device according to the preferred embodiment of the present invention.

FIG. 6 is a circuit diagram of the mode control unit 203' according to another embodiment of the present invention, which comprises a sixth resistor R6, a seventh resistor R7, an eighth resistor R8, a ninth resistor R9, a tenth resistor R10, an eleventh resistor R11, a first comparator CM1, a second comparator CM2, a third comparator CM3, a fourth comparator CM4, a fifth comparator CM5, a sixth comparator CM6 and a current source I1. The mode control unit 203' is adapted for the high-efficiency amplifying device 200 to control the power supply unit 202. Compared with the mode control unit 203 shown in FIG. 4, the mode control unit 203' shown in FIG. 6 monitors the first input signal VIN1 and the second input signal VIN2 to further monitor the drive signal VDRV. Simultaneously, since the mode control unit 203' is able to monitor changes of multiple signals such as VIN1, VIN2, VSP and VSN, is also able to monitor the voltage difference between the drive signal VDRV and the positive power supply VSP or the negative power supply VSN, is also able to monitor the amplitude of all of the drive signal VDRV, the positive power supply VSP and the negative power supply VSN, the mode control unit 203' is able to be called as the multi-signal dynamic monitor circuit.

The sixth resistor R6 has a first terminal and a second terminal, wherein the first terminal of the sixth resistor R6 is connected with the first input terminal IN1 of the power amplifying unit 201 for receiving the first input signal VIN1 (or the third sampling terminal of the mode control unit 203' receives the first input signal VIN1). The seventh resistor R7 has a first terminal and a second terminal, wherein the first terminal of the seventh resistor R7 is connected with the second terminal of the sixth resistor R6. The first current source I1 has a first terminal and a second terminal, wherein the first terminal of the first current source I1 is connected with the second terminal of the seventh resistor R7, the second terminal of the first current source I1 is connected with the ground. The first comparator CM1 has a first input terminal, a second input terminal and an output terminal, wherein the first input terminal of the first comparator CM1 is connected with the second terminal of the sixth resistor R6, the second input terminal of the first comparator CM1 is connected with the first output terminal SP of the power supply unit 202 through the eighth resistor R8 for receiving the positive power supply VSP (or a terminal of the eighth resistor R8 is configured to the first sampling terminal of the mode control unit 203' and is connected with the first output terminal SP of the power supply unit 202 for receiving the positive power supply VSP). The second comparator CM2 has a first input terminal, a second input terminal and an output terminal, wherein the first input terminal of the second comparator CM2 is connected with the second terminal of the seventh resistor R7, the second input terminal of the second comparator CM2 is connected with the second output terminal SN of the power supply unit 202 through the ninth resistor R9 for receiving the negative power supply VSN (or a terminal of the ninth resistor R9 is configured to the second sampling terminal of the mode control unit 203' and is connected with the second output terminal SN of the power supply unit 202 for receiving the negative power supply VSN). The tenth resistor R10 has a first terminal and a second terminal, wherein the first terminal of the tenth resistor R10 is connected with the second input terminal of the first comparator CM1, the second terminal of the tenth resistor R10 is connected with a first reference voltage terminal RF1 for receiving a first reference voltage VRF1.

The eleventh resistor R11 has a first terminal and a second terminal, wherein the first terminal of the eleventh resistor R11 is connected with the second input terminal of the second comparator CM2, the second terminal of the eleventh resistor R11 is connected with the first reference voltage VRF1.

For ease of analysis, it is assumed that the two input terminals of the power amplifying unit 201 respectively receive the differential signals VIN1 and VIN2 (here, VIN=VIN1−VIN2) with the same common-mode level and opposite AC (alternating current) amplitudes. In other examples, the two input terminals of the power amplifying unit 201 are able to respectively receive a reference signal and a single-ended signal. Simultaneously, it is assumed that a voltage amplification factor of the output signal VDRV to the differential signal VIN of the power amplifying unit 201 is A (or a ratio of the drive signal VDRV to the input signal VIN of the power amplifying unit 201 is A), that is, $$VDRV = VIN \times A, \quad (1)$$

$$VIN1 = VRF1 + \frac{VDRV}{2 \times A}, \quad (2)$$

$$VIN2 = VRF1 - \frac{VDRV}{2 \times A}, \quad (3)$$

$$VD1 = VRF1 + \frac{VDRV}{2 \times A - R6 \times I1}, \quad (4)$$

$$VD2 = VRF1 + \frac{VDRV}{2 \times A} - (R6 + R7) \times I1, \quad (5)$$

wherein, VIN1 is the first input terminal voltage of the power amplifying unit 201, VIN2 is the second input terminal voltage of the power amplifying unit 201, VRF1 is the common-mode level voltage, VDRV is the output terminal voltage of the power amplifying unit 201, a first partial voltage VD1 is the first input terminal voltage of the first comparator CM1, a second partial voltage VD2 is the first input terminal voltage of the second comparator CM2.

It is assumed that a ratio of a resistance of the tenth resistor R10 to a resistance of the eighth resistor R8 is P (which is expressed by a formula of R10:R8=P:1), a ratio of a resistance of the eleventh resistor R11 to a resistance of the ninth resistor R9 is Q (which is expressed by a formula of R11:R9=Q:1), then a second terminal voltage (namely, a third partial voltage VD3) of the first comparator CM1 is expressed by a formula of:

$$VD3 = \frac{VRF1 + P \times VSP}{1 + P}, \quad (6)$$

a second terminal voltage (a fourth partial voltage VD4) of the second comparator CM2 is expressed by a formula of:

$$VD4 = \frac{VRF1 + Q \times VSN}{1 + Q}. \quad (7)$$

When the first partial voltage VD1 is equal to the third partial voltage VD3, namely, $$VD1 = VRF1 + \frac{VDRV}{2 \times A} - R6 \times I1 = VD3 = \frac{VRF1 + P \times VSP}{1 + P}, \quad (8)$$

the first comparator CM1 is flipped, at this time, $$\frac{P \times VSP}{1 + P} - \frac{VDRV}{2A} = \frac{VRF1}{1 + P} - R6 \times I1; \quad (9)$$

if:

$$\frac{P}{1 + P} = \frac{1}{2A}, \text{ then} \quad (10)$$

$$VSP - VDRV = (2A - 1) \times VRF1 - 2A \times R6 \times I1 = VTP1, \quad (11)$$

that is, when the drive signal VDRV increases till the voltage difference between the drive signal VDRV and the positive power supply VSP is the first positive threshold VTP1, the output signal of the first monitor circuit 401 (which is abbreviated as a second positive in working signal) is flipped, so as to control the power supply unit 202 to switch to the second positive working mode. Particularly, if A=P=1, the first positive threshold VTP1 is the voltage difference between the positive power supply and the drive signal, so as to facilitate design and calculating the circuit.

It should be noted that conditions defined in the formal (10) are optimal, which is able to accurately obtain voltage values under each power supply. Factually, if:

$$\frac{P}{1 + P} \neq \frac{1}{2A}, \quad (12)$$

The formula (9) still reflects the voltage difference between the drive signal VDRV and the positive power supply VSP. The person skilled in the art is still able to flexibly determine different P, A, R6 and I1 to set the required first positive threshold VTP1, that is, the conditions defined in the formula (10) are the optimized examples of the present invention, and are not the limitations of the present invention.

When the second partial voltage VD2 is equal to the fourth partial voltage VD4, $$VD2 = VRF1 + \frac{VDRV}{2 \times A} - (R6 + R7) \times I1 \quad (13)$$
$$= VD4$$
$$= \frac{VRF1 + Q \times VSN}{1 + Q},$$

the second comparator CM2 is flipped, and at this time, $$\frac{Q \times VSP}{1 + Q} - \frac{VO}{2 \times A} = \frac{VRF}{1 + Q} - (R6 + R7) \times I1, \quad (14)$$

if:

$$\frac{Q}{1 + Q} = \frac{1}{2A}, \quad (15)$$

then $$VSN - VDRV = (2A - 1) \times VRF1 - 2A \times (R6 + R7) \times I1 \quad (16)$$
$$= VTN1,$$

that is, when the drive signal VDRV increases till the voltage difference between the drive signal VDRV and the negative power supply VSN is the first negative threshold VTN1, the output signal of the first monitor circuit 401 (which is abbreviated as a second negative in working signal) is flipped, so as to control the power supply unit 202 to switch to the second negative working mode, and particularly, A=Q=1.

The third comparator CM3 has a first input terminal, a second input terminal and an output terminal, wherein the first input terminal of the third comparator CM3 is connected with the first input terminal of the power amplifying unit 201, the second input terminal of the third comparator CM3 is connected with the second reference voltage VRF2. The fourth comparator CM4 has a first input terminal, a second input terminal and an output terminal, wherein the first input terminal of the fourth comparator CM4 is connected with the second input terminal of the power amplifying unit 201 (or the first input terminal of the fourth comparator CM4 is configured to a fourth sampling terminal of the mode control unit 203' and is connected with the second input terminal of the power amplifying unit 201), the second input terminal of the fourth comparator CM4 is connected with the third reference voltage VRF3.

When the first input terminal voltage VIN1 of the power amplifying unit 201 is equal to the second reference voltage VRF 2, that is, when $$VRF2 = VIN1 = VRF1 + \frac{VDRV}{2 \times A}, \tag{17}$$

the third comparator CM3 is flipped, the power supply unit 202 is out of the second positive working mode through a post-stage circuit. In an example, if:

$$VRF2 = VRF1 + \frac{VSP1}{2 \times A}, \tag{18}$$

that is, when the drive signal VDRV just decreases to the first positive voltage VSP1, the third comparator CM3 is flipped to complete the second positive working mode. In another embodiment, if:

$$VRF2 = VRF1 + \frac{k1 \times VSP1 + x}{2 \times A}, \tag{19}$$

that is, when the drive signal VDRV just decreases near the first positive voltage VSP1, the output signal (which is abbreviated as a first positive in sleep signal) of the third comparator CM3 is flipped to complete the second positive working mode and switches to the first positive sleep mode. It should be noted that the above description is a preferred example. The person skilled in the art is able to flexibly set the second reference voltage. For example, the second reference voltage is proportional to the first positive voltage VSP1, or the second reference voltage maintains a constant difference from the first positive voltage VSP1.

Based on the same principle, when the second input terminal voltage VIN2 of the power amplifying unit 201 is equal to the third reference voltage VRF3, that is, when $$VRF3 = VIN2 = VRF1 - \frac{VDRV}{2 \times A}, \tag{20}$$

the output signal (which is abbreviated as a first negative in sleep signal) of the fourth comparator CM4 is flipped, the power supply unit 202 is out of the first negative sleep mode through a post-stage circuit and switches to the first positive sleep mode. In one example, if $$VRF3 = VRF1 - \frac{VSN1}{2 \times A}, \tag{21}$$

that is, when the drive signal VDRV just decreases to the first positive voltage VSP1, the output signal of the fourth comparator CM4 is flipped to complete the second positive working mode. In another example, if:

$$VRF3 = VRF1 - \frac{k1 \times VSN1 + x}{2 \times A}, \tag{22}$$

that is, when the drive signal VDRV just decreases near the first negative voltage VSN1, the output signal (which is abbreviated as the first negative in sleep signal) of the fourth comparator CM4 is flipped to complete the second negative working mode. It should be noted that the above description is a preferred example. The person skilled in the art is able to flexibly set the third reference voltage. For example, the third reference voltage is proportional to the first negative voltage VSN1, or the third reference voltage maintains a constant difference from the first negative voltage VSN1.

According to a specific example, the first positive voltage VSP1 is equal to the first negative voltage VSN1, that is, $$-VSN1 = VSP1 \tag{23}.$$

According to the formulas (18) and (21), the second reference voltage VRF2 is equal to the third reference voltage VRF3, that is, both the second input terminal of the third comparator CM3 and the second input terminal of the fourth comparator are connected with the same reference signal, so as to simplify the circuit design.

The mode control unit 203' further comprises a fifth comparator CM5 and a sixth comparator CM6. The fifth comparator CM5 has a first input terminal, a second input terminal and an output terminal, wherein the first input terminal of the fifth comparator CM5 is connected with the first input terminal (namely, the third partial voltage VD3) of the first comparator CM1, the second input terminal of the fifth comparator CM5 is connected with the fourth reference voltage VRF4. The sixth comparator CM6 has a first input terminal, a second input terminal and an output terminal, wherein the first input terminal of the sixth comparator CM6 is connected with the second input terminal (namely, the fourth partial voltage VD4) of the second comparator CM2, the second input terminal of the sixth comparator CM6 is connected with the fifth reference voltage VRF5.

When the third partial voltage VD3 is equal to the fourth reference voltage VRF4, namely, $$VRF4 = VD3 = \frac{VRF1 + P \times VSP}{1 + P}, \tag{24}$$

the fifth comparator CM5 is flipped and sends a sleep end signal (namely, voltage-decreased signal) through a post-stage logic gate. In a preferred example, if:

$$VRF4 = VD3 = \frac{VRF1 + P \times VSP1}{1 + P}, \quad (25)$$

that is, when the positive power supply VSP just decreases to the first positive voltage VSP1, the output signal (which is abbreviated as the first positive sleep signal) of the fifth comparator CM5 is flipped, the power supply unit 202 is out of the first positive sleep mode and switches to the first working mode through a post-stage circuit.

When the fourth partial voltage VD4 is equal to the fifth reference voltage VRF5, that is, $$VRF5 = VD4 = \frac{VRF1 + Q \times VSN}{1 + Q} \quad (26)$$

the fifth comparator CM5 is flipped and sends a sleep end signal through a post-stage logic gate. In a preferred example, if:

$$VRF5 = VD4 = \frac{VRF1 + Q \times VSN1}{1 + Q}, \quad (27)$$

that is, when the negative power supply VSN just decreases to the first negative voltage VSN1, the output signal (which is abbreviated as the first negative sleep signal) of the sixth comparator CM6 is flipped, the power supply unit 202 is out of the first negative sleep mode and switches to the first working mode through a post-stage circuit.

In FIG. 6, the mode control unit 203' further comprises a control circuit 601, which has a first input terminal, a second input terminal, a third input terminal, a fourth input terminal, a fifth input terminal, a sixth input terminal and an output terminal, wherein the first input terminal of the control circuit 601 is connected with the output terminal of the first comparator CM1 for receiving the second positive in working signal, the second input terminal of the control circuit 601 is connected with the output terminal of the second comparator CM2 for receiving the second negative in working signal, the third input terminal of the control circuit 601 is connected with the output terminal of the third comparator CM3 for receiving the first positive in sleep signal, the fourth input terminal of the control circuit 601 is connected with the output terminal of the fourth comparator CM4 for receiving the first negative in sleep signal, the fifth input terminal of the control circuit 601 is connected with the output terminal of the fifth comparator CM5 for receiving the first positive out sleep signal, the sixth input terminal of the control circuit 601 is connected with the output terminal of the sixth comparator CM6 for receiving the first negative out sleep signal, the output terminal of the control circuit 601 outputs the control signal CON for controlling the working mode of the power supply unit 202.

When the second positive in working signal acts (such as when the first comparator CM1 mentioned above is flipped), the control signal CON controls the power supply unit 202 to switch to the second positive working mode; when the second negative in working signal acts (such as when the second comparator CM2 mentioned above is flipped), the control signal CON controls the power supply unit 202 to switch to the second negative working mode. When the first positive in sleep signal acts, the control signal CON controls the power supply unit 202 to switch out of the second positive working mode and to switch to the first positive sleep mode; when the first negative in sleep signal acts, the control signal CON controls the power supply unit 202 to switch out of the second negative working mode and to switch to the first negative sleep mode. When the first positive out sleep signal acts, the control signal CON controls the power supply unit 202 to switch out of the first positive sleep mode and to switch to the first working mode. When the first negative out sleep signal acts, the control signal CON controls the power supply unit 202 to switch out of the first negative sleep mode and to switch to the first working mode.

Figure 7:
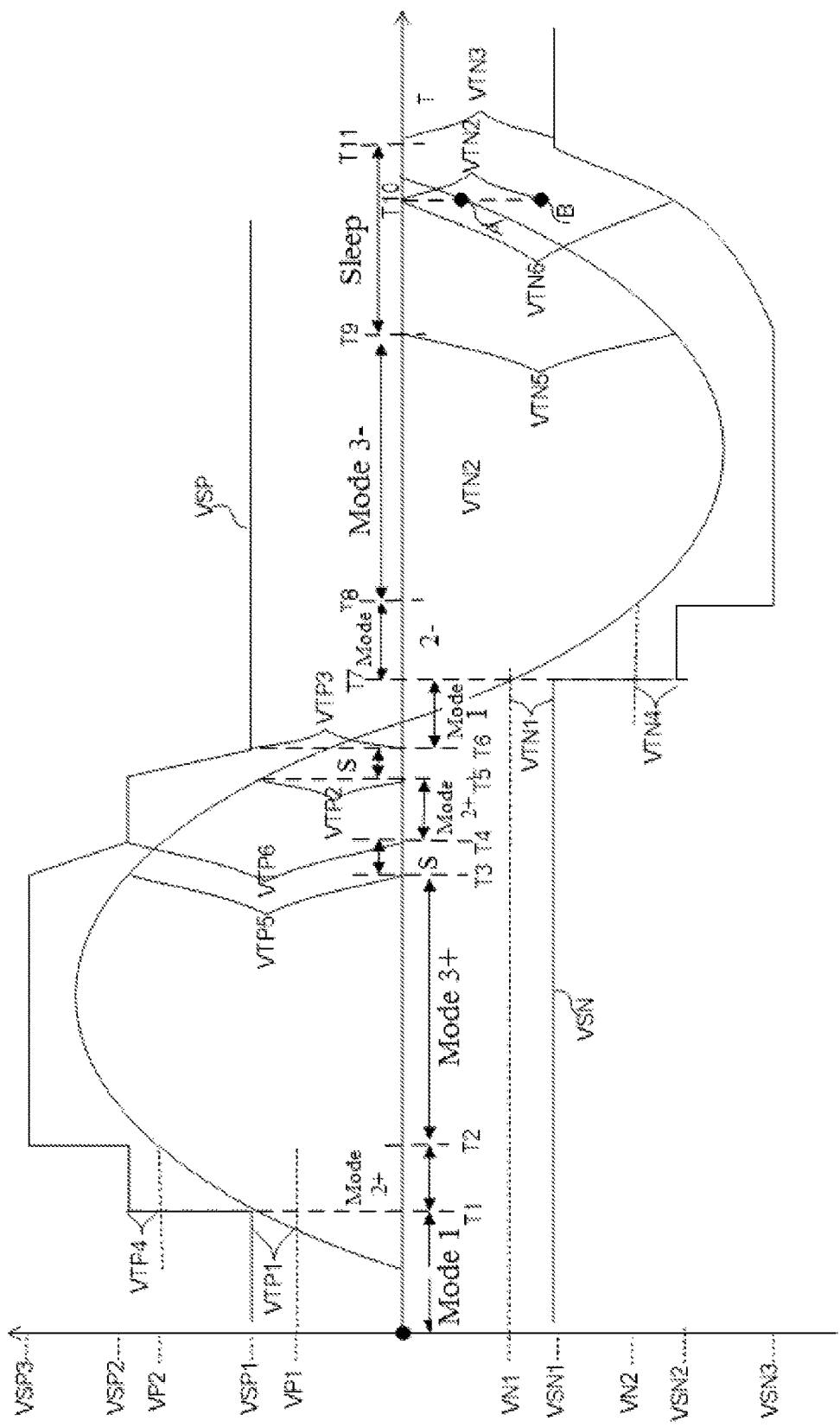
FIG. 7 is another working waveform diagram of the high-efficiency amplifying device according to the preferred embodiment of the present invention.
Figure 8:
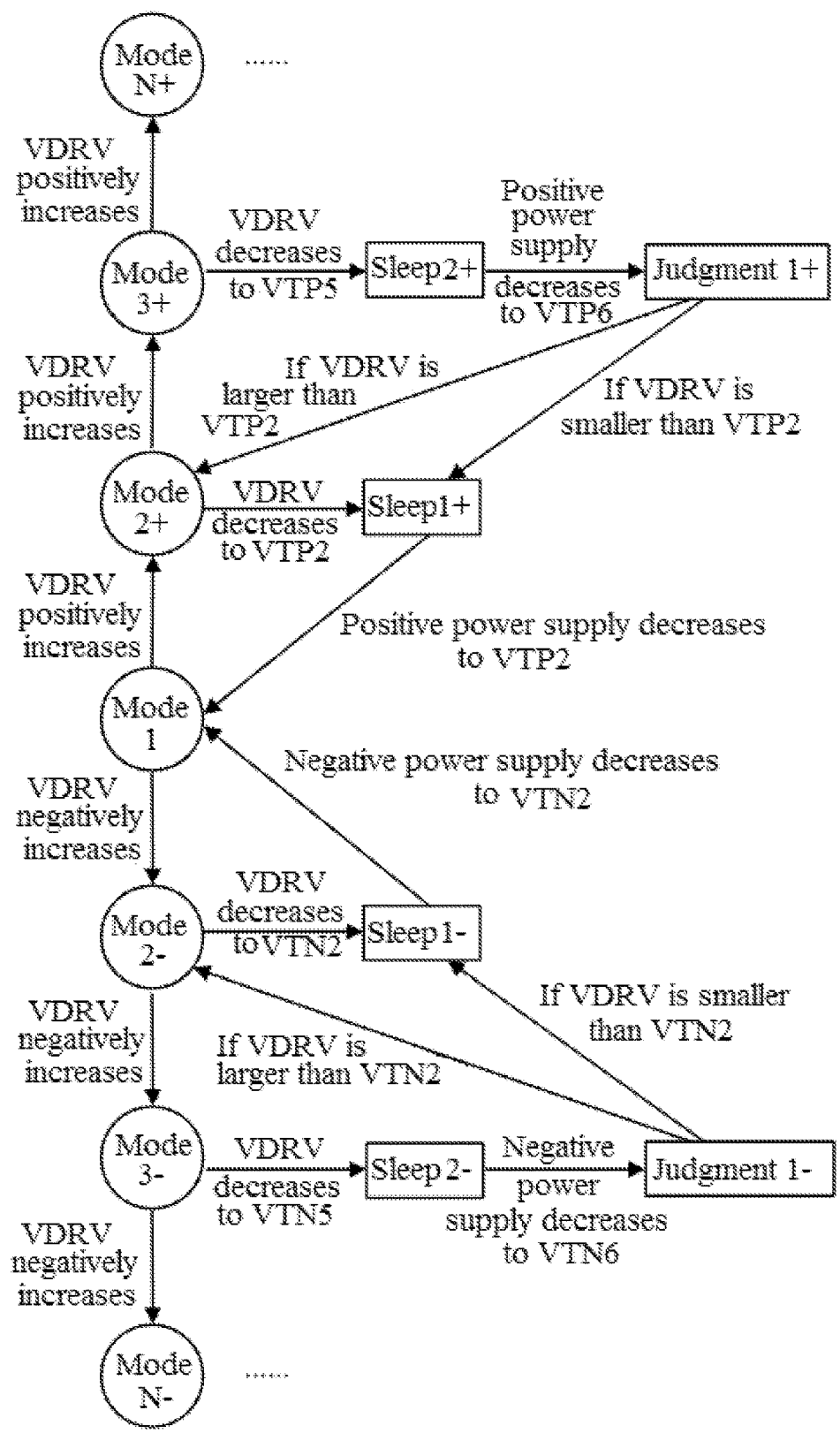
FIG. 8 is a flow chart of a method for controlling a power supply of the high-efficiency amplifying device.

FIG. 7 is another working waveform diagram of a high-efficiency amplifying device 200. FIG. 8 is a flow chart of a method for controlling a power supply of the high-efficiency amplifying device.

As shown in FIG. 7, the high-efficiency amplifying device 200 is able to work in a third positive working mode and a third negative working mode. If the power supply unit works in the third positive working mode, the positive power supply and the negative power supply respectively have a third positive voltage VSP3 (such as 2.7 V) and the first negative voltage VSN1; if the power supply unit works in the third negative working mode, the positive power supply and the negative power supply respectively have the first positive voltage VSP31 and a third negative voltage VSN3 (such as −2.7 V).

While working in the first working mode (mode 1), the first power terminal voltage of the power supply unit 202 is VSP1; with the gradual increase of the drive signal VDRV, the voltage difference between the drive signal VDRV and the first positive voltage VSP1 is getting smaller and smaller; when the voltage difference, between the positive power supply VSP (which is generally regarded as the first positive voltage VSP1 while ignoring changes caused by changing power supply and load current) and the output signal VDRV is smaller than the first positive threshold VTP1 (at time T1), the mode control unit 203 controls the power supply unit 202 to switch to the second positive working mode (mode 2+), the first power terminal voltage of the power supply unit 202 quickly increases to VSP2 to prevent clipping distortion of the drive signal VDRV, and the negative power supply VSN still maintains the first negative voltage VSN1 to reduce the energy loss.

While working in the second positive working mode (mode 2+), the first power terminal voltage of the power supply unit 202 is VSP2. With the drive signal VDRV gradually increases, the voltage difference between the drive signal VDRV and the second positive voltage VSP2 is getting smaller and smaller. When the voltage difference between the positive power supply VSP (which is generally regarded as the second positive voltage VSP2 while ignoring changes caused by changing power supply and load current) and the drive signal VDRV is smaller than a fourth positive threshold VTP4 (at time T2), the mode control unit 203 controls the power supply unit 202 to switch to the third positive working mode (mode 3+), the first power terminal voltage of the power supply unit 202 quickly increases to the third positive voltage VSP3, so as to prevent the drive signal from being clipped and then distorted. The negative power supply VSN still remains the first negative voltage VSN1 to reduce power consumption. In some examples, the first positive voltage VSP1 of the power supply unit 202 is substantially constant and is unchanged with the inputted power supply of the power supply unit 202 (such as BUCK or BOOST which adopts closed-loop control). The mode control unit 203 is able to only monitor the amplitude of the drive signal VDRV without monitoring the voltage difference between the drive signal VDRV and the first power supply VSP. The power supply unit is able to directly switch to the second positive working mode based on the amplitude of the drive signal VDRV, that is, when the drive signal VDRV increases to the first positive number VP1, the mode control unit 203 controls the power supply unit 202 to switch to the second positive working mode; when the drive signal VDRV increases to the second positive number VP2, the mode control unit 203 controls the power supply unit 202 to switch to the third positive working mode.

While working in the third positive working mode, the first power terminal voltage of the power supply unit 202 is the third positive voltage VSP3. With the drive signal VDRV decreases, if the power amplifying unit 201 continuously uses the third positive voltage VSP3 which is so high, the energy waste is produced. Therefore, when the drive signal VDRV decreases to a fifth positive threshold VTP5 (at time T3), the mode control unit 203 controls the power supply unit 202 to switch out of the third positive working mode.

While being out of the third positive working mode, the power supply unit 202 switches to a second positive sleep mode instead of the second working mode. During the period of the second positive sleep mode, the power supply unit 202 stops or reduces the power supply for the capacitor which is connected with the first output terminal thereof. Due to the charge storage effect of the output capacitor, the first output terminal voltage of the power supply unit 202 gradually decreases from VSP3, when the positive power supply thereof decreases to a sixth positive threshold VTP6 (at time T4), the mode control unit determines whether the power supply unit switches to the second positive working mode or the sleep mode based on the audio signal at this time. In an example, if the drive signal VDRV is smaller than the second positive threshold VTP2, as shown in FIG. 8, the power supply unit 202 switches to the first positive sleep mode; if the drive signal VDRV is larger than the second positive threshold VTP2, as shown in FIG. 7, the mode control unit controls the power supply unit 202 to switch out of the sleep mode and switches to the second positive working mode.

While working in the second positive working mode, the first power terminal voltage of the power supply unit 202 is the second positive voltage VSP2. With the drive signal VDRV gradually decreases, if the power amplifying unit 201 continuously uses the second positive voltage VSP2 which is so high, the energy waste is produced. Therefore, when the drive signal VDRV decreases to the second positive threshold VTP2 (at time T5), the mode control unit 203 controls the power supply unit 202 to switch out of the second positive working mode.

While being out of the second positive working mode, the power supply unit 202 switches to the first positive sleep mode instead of the first working mode. During the period of the first positive sleep mode, the power supply unit 202 stops or reduces the power supply for the capacitor which is connected with the first output terminal thereof. Due to the charge storage effect of the output capacitor, the first output terminal voltage of the power supply unit 202 gradually decreases from VSP2, when the positive power supply thereof decreases to the third positive threshold VTP3 (at time T6), the mode control unit 203 controls the power supply unit 202 switch out of the first positive sleep mode and switches to the first working mode.

Based on the same principle, while working in the first working mode, the second power terminal voltage of the power supply unit 202 is VSN1. With the drive signal VDRV gradually increases, the voltage difference between the drive signal VDRV and the first negative voltage VSN1 is getting smaller and smaller. When the voltage difference between the negative power supply VSN (which is generally regarded as the first negative voltage VSN1 while ignoring changes caused by changing power supply and load current) and the drive signal VDRV is smaller than the first negative threshold VTN1 (at time T7), the mode control unit 203 controls the power supply unit 202 to switch to the second negative working mode, the second power terminal voltage of the power supply unit 202 quickly increases to VSN2, so as to prevent the drive signal from being clipped and then distorted. The positive power supply VSP still remains the first positive voltage VSP1 to reduce power consumption.

While working in the second negative working mode (mode 2−), the second power terminal voltage of the power supply unit 202 is VSN2. With the drive signal VDRV gradually negatively increases, the voltage difference between the drive signal VDRV and the second negative voltage VSN2 is getting smaller and smaller. When the voltage difference between the negative power supply VSN (which is generally regarded as the second negative voltage VSN2 while ignoring changes caused by changing power supply and load current) and the drive signal VDRV is smaller than a fourth negative threshold VTN4 (at time T8), the mode control unit 203 controls the power supply unit 202 to switch to the third negative working mode (mode 3−), the second power terminal voltage of the power supply unit 202 quickly increases to the third negative voltage VSN3, so as to prevent the drive signal from being clipped and then distorted. The positive power supply VSP still remains the first positive voltage VSP1 to reduce power consumption. In some examples, the first negative voltage VSN1 of the power supply unit 202 is substantially constant and is unchanged with the inputted power supply of the power supply unit 202 (such as BUCK which adopts closed-loop control). The mode control unit 203 is able to only monitor the amplitude of the drive signal VDRV without monitoring the voltage difference between the drive signal VDRV and the negative power supply VSN. The power supply unit is able to directly switch to the second negative working mode based on the amplitude of the drive signal VDRV, that is, when the drive signal VDRV increases to the first negative number VN1, the mode control unit 203 controls the power supply unit 202 to switch to the second negative working mode; when the drive signal VDRV increases to the second negative number VN2, the mode control unit 203 controls the power supply unit 202 to switch to the third negative working mode.

While working in the third negative working mode, the second power terminal voltage of the power supply unit 202 is the third negative voltage VSN3. With the drive signal VDRV decreases, if the power amplifying unit 201 continuously uses the third negative voltage VSN3 which is so high, the energy waste is produced. Therefore, when the drive signal VDRV decreases to a fifth negative threshold VTN5 (at time T9), the mode control unit 203 controls the power supply unit 202 to switch out of the third negative working mode.

While being out of the third negative working mode, the power supply unit 202 switches to a second negative sleep mode instead of the second negative working mode. During the period of the second negative sleep mode, the power supply unit 202 stops or reduces the power supply for the capacitor (such as C2) which is connected with the second output terminal thereof. Due to the charge storage effect of the output capacitor, the second output terminal voltage of the power supply unit 202 gradually decreases from VSN3, when the negative power supply thereof decreases to a sixth negative threshold VTN6 (at time T10), the mode control unit determines whether the power supply unit switches to the second negative working mode or continuously sleeping based on the drive signal VDRV at this time.

According to an example, if the drive signal VDRV (which is represented by A in FIG. 7) is smaller than the second negative threshold VTN2 (which is represented by B in FIG. 7), the power supply unit 202 continuously the sleep mode (or switches to the first negative sleep mode). During the period of the first negative sleep mode, the power supply unit 202 stops or reduces the power supply for the capacitor which is connected with the second output terminal thereof. Due to the charge storage effect of the output capacitor, the second output terminal voltage of the power supply unit 202 gradually decreases from VSN2 to near the ground potential, when the negative power supply thereof decreases to a third negative threshold VTN3 (at time T10), the power supply unit 202 switches out of the first negative sleep mode and to the first working mode.

According to an example of the present invention, when the drive signal VDRV is larger than the second negative threshold VTN2, as shown in FIG. 8, the mode control unit 203 controls the power supply unit 202 to switch out of the second negative sleep mode and switches to the second negative working mode. While working in the second negative working mode, the first power terminal voltage of the power supply unit 202 is VSN2. With the drive signal VDRV decreases, if the power amplifying unit 201 continuously uses the second negative voltage VSN2 which is so high, the energy waste is produced. Therefore, when the drive signal VDRV decreases to a second negative threshold VTN2 (at time T5 in FIG. 5), the mode control unit 203 controls the power supply unit 202 to switch out of the second negative working mode. While being out of the second negative working mode, the power supply unit 202 switches to the first negative sleep mode instead of the first working mode. During the period of the first positive sleep mode, the power supply unit 202 stops or reduces the power supply for the capacitor which is connected with the second output terminal thereof. Due to the charge storage effect of the output capacitor, the second output terminal voltage of the power supply unit 202 gradually decreases from VSN2, when the positive power supply thereof decreases to a third positive threshold VTP3 (at time T6 in FIG. 5), the mode control unit 203 controls the power supply unit 202 to switch out of the first negative sleep mode and to switch to the first working mode.

As shown in FIG. 8, the present invention also provides a method for controlling the power supply unit 202 of the amplifying device 200 mentioned above, wherein the amplifying device is adapted for receiving an input signal VIN and providing a drive signal VDRV at an output terminal thereof, the power supply unit 202 is adapted for providing the positive power supply and the negative power supply for the power amplifying unit 201.

The method comprises steps of:

if an input signal of the power amplifying unit is zero or substantially small, the power supply unit working in a first working mode (mode 1), wherein the positive power supply has a first positive voltage VSP1, the negative power supply has a first negative voltage VSN1;

if the power supply unit works in the first working mode, when the drive signal VDRV increases to a first positive number VP1, or the drive signal VDRV increases till a voltage difference between the drive signal and the positive power supply VSP is a first positive threshold VTP1, the power supply unit 202 switching to a second positive working mode (mode 2+), wherein the positive power supply has a second positive voltage VSP2, the negative power supply has the first negative voltage VSN1;

if the power supply unit works in the second positive working mode, when the drive signal VDRV increases to a second positive number VP2, or the drive signal VDRV increases till the voltage difference between the drive signal and the positive power supply VSP is a fourth positive threshold VTP4, the power supply unit switching to a third positive working mode (mode 3+), wherein the positive power supply has a third positive voltage VSP3, the negative power supply has the first negative voltage VSN1; when the drive signal VDRV decreases to a second positive threshold VTP2, the power supply unit 202 switching to a first positive sleep mode (sleep 1+);

if the power supply unit works in a third positive working mode, when the drive signal of the power amplifying unit decreases to a fifth positive threshold VTP5, the power supply unit switching to a second positive sleep mode (sleep 2+);

if the power supply unit works in the second positive sleep mode, when the positive power supply decreases to a sixth positive threshold VTP6, performing a first positive judgment, if the drive signal VDRV is smaller than the second positive threshold VTP2, the power supply unit switching to the first positive sleep mode (sleep 1+); if the drive signal VDRV is larger than the second positive threshold VTP2, the power supply unit switching to the second positive working mode; and if the power supply unit works in the first positive sleep mode, when the positive power supply decreases to the second positive threshold VTP2, the power supply unit switching to the first working mode;

wherein the third positive voltage VSP3 is larger than the second positive voltage VSP2, the second positive voltage VSP2 is larger than the first positive voltage VSP1, the fifth positive threshold VTP5 is larger than the second positive threshold VTP2, the sixth positive threshold VTP6 is larger than the third positive threshold VTP3.

Preferably, the method further comprises steps of:

if the power supply unit works in the first working mode, when the drive signal VDRV increases to a first negative number VN1, or the drive signal VDRV increases till a voltage difference between the drive signal VDRV and the negative power supply VSN is a first negative threshold VTN1, the power supply unit 202 switching to a second negative working mode (mode 2−), wherein the negative power supply VSN has a second negative voltage VSN2, the positive power supply VSP has the first positive voltage VSP1;

if the power supply unit works in the second negative working mode, when the drive signal VDRV increases to a second negative number VN2, or the drive signal VDRV increases till the voltage difference between the drive signal and the negative power supply VSN is a fourth negative threshold VTN4, the power supply unit switching to a third negative working mode (mode 3−), wherein the negative power supply VSN has a third negative voltage VSN3, the positive power supply VSP has the first positive voltage VSP1; when the drive signal decreases to a second negative threshold VTN2, the power supply unit 202 switching to a first negative sleep mode (sleep 1−);

if the power supply unit works in the third negative working mode, when the drive signal of the power amplifying unit decreases to a fifth negative threshold VTN5, the power supply unit switching to a second negative sleep mode (sleep 2−);

if the power supply unit works in the second negative sleep mode, when the negative power supply decreases to a sixth negative threshold VTN6, performing a first negative judgment, if the drive signal VDRV is smaller than the second negative threshold VTN2, the power supply unit switching to the first negative sleep mode (sleep 1−); if the drive signal VDRV is larger than the second negative threshold VTN2, the power supply unit switching to the second negative working mode; and if the power supply unit works in the first negative sleep mode, when the negative power supply decreases to the second negative threshold VTN2, the power supply unit switching to the first working mode;

wherein the third negative voltage VSN3 is larger than the second negative voltage VSN2, the second negative voltage VSN2 is larger than the first negative voltage VSN1, the fifth negative threshold VTN5 is larger than the second negative threshold VTN2, the sixth negative threshold VTN6 is larger than the third negative threshold VTN3.

Preferably, the power supply unit 202 is able to works in an $N^{th}$ positive working mode and an $N^{th}$ negative working mode;

if the power supply unit 202 works in the $N^{th}$ positive working mode, the positive power supply and the negative power supply respectively have an $N^{th}$ positive voltage and the first negative voltage; if the power supply unit 202 works in the $N^{th}$ negative working mode, the positive power supply and the negative power supply respectively have the first positive voltage and an $N^{th}$ negative voltage;

wherein the $N^{th}$ positive voltage is larger than a $(N-1)^{th}$ positive voltage, the $N^{th}$ negative voltage is larger than a $(N-1)^{th}$ negative voltage, here, N is an integer lager than three.

The quantifiers "a", "an", and the like in this disclosure do not exclude a plurality. The terms "first", "second", and the like in the present invention merely indicate the order of appearance in the description of the specification in order to distinguish similar components. The terms "first" and "second" in the claims are intended only to facilitate a quick understanding of the claims and not the limitation. Any reference signs in the claims should not be construed as limiting the protective scope of the present invention.

What is claimed is:

1. An amplifying device, comprising:
a power amplifying unit which has a first input terminal, a second input terminal, an output terminal, a first power terminal and a second power terminal, wherein the first power terminal is adapted for receiving a positive power supply, the second power terminal is adapted for receiving a negative power supply, the output terminal is adapted for receiving a drive signal;
a power supply unit which has a control terminal, a first output terminal for providing the positive power supply and a second output terminal for providing the negative power supply, wherein the first output terminal of the power supply unit is connected with the first power terminal of the power amplifying unit, the second output terminal of the power supply unit is connected with the second power terminal of the power amplifying unit; and
a mode control unit which has a first sampling terminal, a second sampling terminal, a third sampling terminal and an output terminal, wherein the first sampling terminal is connected with the first output terminal of the power supply unit, the second sampling terminal is connected with the second output terminal of the power supply unit, the third sampling terminal is connected with the first input terminal of the power amplifying unit, the output terminal of the mode control unit is connected with the control terminal of the power supply unit, the mode control unit controls a working mode of the power supply unit based on an output voltage of the power supply unit, wherein:
if the power supply unit works in a first working mode, the positive power supply and the negative power supply respectively have a first positive voltage and a first negative voltage;
if the power supply unit works in a second positive working mode, the positive power supply and the negative power supply respectively have a second positive voltage and the first negative voltage;
if the power supply unit works in a second negative working mode, the positive power supply and the negative power supply respectively have the first positive voltage and a second negative voltage;
the second positive voltage is larger than the first positive voltage; and the second negative voltage is larger than the first negative voltage.

2. The amplifying device, as recited in claim 1, wherein the power supply unit is able to work in a third positive working mode or a third negative working mode;
if the power supply unit works in the third positive working mode, the positive power supply and the negative supply respectively have a third positive voltage and the first negative voltage;
if the power supply unit works in the third negative working mode; the positive power supply and the negative supply respectively have the first positive voltage and a third negative voltage;
the third positive voltage is larger than the second positive voltage, and the third negative voltage is larger than the second negative voltage.

3. The amplifying device, as recited in claim 1, wherein the power supply unit is able to work in a first positive sleep mode, a second positive sleep mode, a first negative sleep mode and a second negative sleep mode;
if the power supply unit works in the first positive sleep mode, the power supply unit reduces or stops providing current for the first output terminal thereof;
if the power supply unit works in the second positive sleep mode, the power supply unit reduces or stops providing current for the first output terminal thereof;
if the power supply unit works in the first negative sleep mode, the power supply unit reduces or stops providing current for the second output terminal thereof;
if the power supply unit works in the second negative sleep mode; the power supply unit reduces or stops providing current for the second output terminal thereof.

4. The amplifying device, as recited in claim 1, wherein the power amplifying unit comprises:
a first amplifier which has a first input terminal, a second input terminal; an output terminal, a first power terminal and a second power terminal, wherein the first power terminal of the first amplifier is adapted for receiving the positive power supply, the second power terminal of the first amplifier is adapted for receiving the negative power supply, the output terminal of the first amplifier is adapted for providing the drive signal;

a first resistor which has a first terminal and a second terminal, wherein the first terminal of the first resistor is connected with the first input terminal of the power amplifying unit, the second terminal of the first resistor is connected with the first input terminal of the first amplifier;

a second resistor which has a first terminal and a second terminal, wherein the first terminal of the second resistor is connected with the second input terminal of the power amplifying unit, the second terminal of the second resistor is connected with the second input terminal of the first amplifier;

a third resistor which has a first terminal and a second terminal, wherein the first terminal of the third resistor is connected with the first input terminal of the first amplifier, the second terminal of the third resistor is connected with ground; and a fourth resistor which has a first terminal and a second terminal, wherein the first terminal of the fourth resistor is connected with the second input terminal of the first amplifier, the second terminal of the fourth resistor is connected with the output terminal of the power amplifying unit;

a ratio of a resistance of the first resistor to a resistance of the third resistor is equal to a ratio of a resistance of the second resistor to a resistance of the fourth resistor.

5. The amplifying device, as recited in claim 1, wherein:

if an input signal of the power amplifying unit is zero, the power supply unit works in the first working mode;

if the power supply unit works in the first working mode, when the drive signal increases to a first positive number, or the drive signal increases till a voltage difference between the drive signal and the positive power supply is a first positive threshold, the power supply unit switches to the second positive working mode;

if the power supply unit works in the second positive working mode, when the drive signal increases to a second positive number, or the drive signal increases till the voltage difference between the drive signal and the positive power supply is a fourth positive threshold, the power supply unit switches to the third positive working mode; when the drive signal decreases, the drive signal of the power amplifying unit decreases to a second positive threshold, the power supply unit switches to a first positive sleep mode;

if the power supply unit works in the third positive working mode, when the drive signal of the power amplifying unit decreases to a fifth positive threshold, the power supply unit switches to a second positive sleep mode;

if the power supply unit works in the second positive sleep mode, when the positive power supply decreases to a sixth positive threshold, if the drive signal is smaller than the second positive threshold, the power supply unit switches to the first positive sleep mode; if the drive signal is larger than the second positive threshold, the power supply unit switches to the second positive working mode;

if the power supply unit works in the first positive sleep mode, when the positive power supply decreases to a third positive threshold, the power supply unit switches to the first working mode.

6. The amplifying device, as recited in claim 2, wherein:

if an input signal of the power amplifying unit is zero, the power supply unit works in the first working mode;

if the power supply unit works in the first working mode, when the drive signal increases to a first positive number, or the drive signal increases till a voltage difference between the drive signal and the positive power supply is a first positive threshold, the power supply unit switches to the second positive working mode;

if the power supply unit works in the second positive working mode, when the drive signal increases to a second positive number, or the drive signal increases till the voltage difference between the drive signal and the positive power supply is a fourth positive threshold, the power supply unit switches to the third positive working mode; when the drive signal decreases, the drive signal of the power amplifying unit decreases to a second positive threshold, the power supply unit switches to a first positive sleep mode;

if the power supply unit works in the third positive working mode, when the drive signal of the power amplifying unit decreases to a fifth positive threshold, the power supply unit switches to a second positive sleep mode;

if the power supply unit works in the second positive sleep mode, when the positive power supply decreases to a sixth positive threshold, if the drive signal is smaller than the second positive threshold, the power supply unit switches to the first positive sleep mode; if the drive signal is larger than the second positive threshold, the power supply unit switches to the second positive working mode;

if the power supply unit works in the first positive sleep mode, when the positive power supply decreases to a third positive threshold, the power supply unit switches to the first working mode.

7. The amplifying device, as recited in claim 3, wherein:

if an input signal of the power amplifying unit is zero, the power supply unit works in the first working mode;

if the power supply unit works in the first working mode, when the drive signal increases to a first positive number, or the drive signal increases till a voltage difference between the drive signal and the positive power supply is a first positive threshold; the power supply unit switches to the second positive working mode;

if the power supply unit works in the second positive working mode, when the drive signal increases to a second positive number, or the drive signal increases till the voltage difference between the drive signal and the positive power supply is a fourth positive threshold, the power supply unit switches to the third positive working mode; when the drive signal decreases, the drive signal of the power amplifying unit decreases to a second positive threshold, the power supply unit switches to the first positive sleep mode;

if the power supply unit works in the third positive working mode, when the drive signal of the power amplifying unit decreases to a fifth positive threshold; the power supply unit switches to the second positive sleep mode;

if the power supply unit works in the second positive sleep mode, when the positive power supply decreases to a sixth positive threshold, if the drive signal is smaller than the second positive threshold, the power supply unit switches to the first positive sleep mode; if the drive signal is larger than the second positive threshold, the power supply unit switches to the second positive working mode;

if the power supply unit works in the first positive sleep mode; when the positive power supply decreases to a third positive threshold, the power supply unit switches to the first working mode.

8. The amplifying device, as recited in claim 7, wherein:
if the power supply unit works in the first working mode, when the drive signal increases to a first negative number, or the drive signal increases till a voltage difference between the drive signal and the negative power supply is a first negative threshold, the power supply unit switches to the second negative working mode;

if the power supply unit works in the second negative working mode, when the drive signal increases to a second negative number; or the drive signal increases till the voltage difference between the drive signal and the negative power supply is a fourth negative threshold, the power supply unit switches to the third negative working mode; when the drive signal decreases, the drive signal of the power amplifying unit decreases to a second negative threshold, the power supply unit switches to a first negative sleep mode;

if the power supply unit works in the third negative working mode, when the drive signal of the power amplifying unit decreases to a fifth negative threshold, the power supply unit switches to a second negative sleep mode;

if the power supply unit works in the second negative sleep mode, when the negative power supply decreases to a sixth negative threshold, if the drive signal is smaller than the second negative threshold, the power supply unit switches to the first negative sleep mode; if the drive signal is larger than the second negative threshold, the power supply unit switches to the second negative working mode;

if the power supply unit works in the first negative sleep mode, when the negative power supply decreases to a third negative threshold, the power supply unit switches to the first working mode.

9. The amplifying device, as recited in claim 8, wherein: both the second positive threshold and the third positive threshold are equal to the first positive voltage, both the fifth positive threshold and the sixth positive threshold are equal to the second positive voltage, both the second negative voltage and the third negative voltage are equal to the first negative voltage, both the fifth negative threshold and the sixth negative threshold are equal to the second negative voltage; the first positive voltage and the first negative voltage are same in amplitude and opposite in polarity, the second positive voltage and the second negative voltage are same in amplitude and opposite in polarity.

10. The amplifying device, as recited in claim 1, wherein: the power supply unit is able to work in an $N^{th}$ positive working mode and an $N^{th}$ negative working mode, here, $N \geq 3$;

if the power supply unit works in the $N^{th}$ positive working mode; the positive power supply and the negative power supply respectively have an $N^{th}$ positive voltage and the first negative voltage;

if the power supply unit works in the $N^{th}$ negative working mode, the positive power supply and the negative power supply respectively have the first positive voltage and an $N^{th}$ negative voltage;

the $N^{th}$ positive voltage is larger than a $(N-1)^{th}$ positive voltage, the $N^{th}$ negative voltage is larger than a $(N-1)^{th}$ negative voltage, here, N is an integer lager than three.

11. The amplifying device, as recited in claim 1, wherein the mode control unit comprises:

a sixth resistor which has a first terminal and a second terminal, wherein the first terminal of the sixth resistor is connected with the first input terminal of the power amplifying unit;

a seventh resistor which has a first terminal and a second terminal, wherein the first terminal of the seventh resistor is connected with the second terminal of the sixth resistor;

a current source which has a first terminal and a second terminal, wherein the first terminal of the current source is connected with second terminal of the seventh resistor, the second terminal of the current source is connected with ground;

a first comparator which has a first input terminal, a second input terminal and an output terminal, wherein the first input terminal of the first comparator is connected with the second terminal of the sixth resistor, the second input terminal of the first comparator is connected with the first output terminal of the power supply unit through the eighth resistor, the output terminal of the first comparator is adapted for providing a second positive in working signal;

a second comparator which has a first input terminal, a second input terminal and an output terminal, wherein the first input terminal of the second comparator is connected with the second terminal of the seventh resistor, the second input terminal of the second comparator is connected with the second output terminal of the power supply unit through the ninth resistor, the output terminal of the second comparator is adapted for providing a second negative in working signal;

a tenth resistor which has a first terminal and a second terminal, wherein the first terminal of the tenth resistor is connected with the second input terminal of the first comparator, the second terminal of the tenth resistor is connected with a reference voltage; and an eleventh resistor which has a first terminal and a second terminal, wherein the first terminal of the eleventh resistor is connected with the second input terminal of the second comparator, the second terminal of the eleventh resistor is connected with the reference voltage.

12. The amplifying device, as recited in claim 11, wherein a voltage amplification factor of the power amplifying unit is A, a ratio of a resistance of the tenth resistor to a resistance of the eighth resistor is a ratio of a resistance of the eleventh resistor to a resistance of the ninth resistor is Q, here $$\frac{P}{1+P} = \frac{1}{2A},$$
$$\frac{Q}{1+Q} = \frac{1}{2A}.$$

13. The amplifying device, as recited in claim 11, wherein the mode control unit further comprises:

a third comparator which has a first input terminal, a second input terminal and an output terminal, wherein the first input terminal of the third comparator is connected with the first input terminal of the power amplifying unit, the second input terminal of the third comparator is connected with a second reference voltage, the output terminal of the third comparator is adapted for providing a first positive in sleep signal;

a fourth comparator which has a first input terminal, a second input terminal and an output terminal, wherein the first input terminal of the fourth comparator is connected with the second input terminal of the power amplifying unit, the second input terminal of the fourth comparator is connected with a third reference voltage, the output terminal of the fourth comparator is adapted for providing a first negative in sleep signal;

a fifth comparator which has a first input terminal, a second input terminal and an output terminal, wherein the first input terminal of the fifth comparator is connected with the second input terminal of the first comparator, the second input terminal of the fifth comparator is connected with a fourth reference voltage, the output terminal of the fifth comparator is adapted for providing the first positive out sleep signal; and a sixth comparator which has a first input terminal, a second input terminal and an output terminal, wherein the first input terminal of the sixth comparator is connected with the second input terminal of the second comparator, the second input terminal of the sixth comparator is connected with a fifth reference voltage, the output terminal of the sixth comparator is adapted for providing the first negative out sleep signal.

14. The amplifying device, as recited in claim 13, wherein: a ratio of a resistance of the tenth resistor to a resistance of the eighth resistor is P, a voltage amplification factor of the power amplifying unit is A, a ratio of a resistance of the eleventh resistor to a resistance of the ninth resistor is Q; the first reference voltage (VRF1), the second reference voltage (VRF2), the third reference voltage (VRF3), the fourth reference voltage (VRF4), the fifth reference voltage (VRF5), the first positive voltage (VSP1) and the first negative voltage (VSN1) meet formulas of:

$$VRF2 = VRF1 + \frac{VSP1}{2 \times A},$$

$$VRF3 = VRF1 - \frac{VSN1}{2 \times A},$$

$$VRF4 = \frac{VRF1 + P \times VSP1}{1 + P},$$

$$VRF5 = \frac{VRF1 + Q \times VSN1}{1 + Q}.$$

15. The amplifying device, as recited in claim 14, wherein: the mode control unit comprises a control circuit; the control circuit has a first input terminal; a second input terminal, a third input terminal, a fourth input terminal, a fifth input terminal, a sixth input terminal and an output terminal, wherein the first input terminal of the control circuit is connected with the output terminal of the first comparator for receiving the second positive in working signal, the second input terminal of the control circuit is connected with the output terminal of the second comparator for receiving the second negative in working signal, the third input terminal of the control circuit is connected with the output terminal of the third comparator for receiving the first positive in sleep signal, the fourth input terminal of the control circuit is connected with the output terminal of the fourth comparator for receiving the first negative in sleep signal, the fifth input terminal of the control circuit is connected with the output terminal of the fifth comparator for receiving a first positive out sleep signal; the sixth input terminal of the control circuit is connected with the output terminal of the sixth comparator for receiving the first negative out sleep signal, the output terminal of the control circuit is adapted for providing the control signal to control working mode of the power supply unit;

when the second positive in working signal is enabled, the power supply unit switches to the second positive working mode; when the second negative in working signal is enabled, the power supply unit switches to the second negative working mode; when the first positive in sleep signal is enabled, the power supply unit switches out of the second positive working mode and switches to the first positive sleep mode; when the first negative in sleep signal is enabled, the power supply unit switches out of the second negative working mode and switches to the first negative sleep mode; when the first positive out sleep signal is enabled, the power supply unit switches out of the first positive sleep mode and switches to the first working mode; when the first negative out sleep signal is enabled, the power supply unit switches out of the first negative sleep mode and switches to the first working mode.

16. A method for controlling a power supply unit of an amplifying device, wherein a power amplifying unit is adapted for receiving an input signal and providing a drive signal at an output terminal thereof, the power supply unit is adapted for providing a positive power supply and a negative power supply for the power amplifying unit, the method comprises steps of:

if the input signal of the power amplifying unit is zero, the power supply unit working in a first working mode, wherein the positive power supply has a first positive voltage, the negative power supply has a first negative voltage;

if the power supply unit works in the first working mode, when the drive signal increases to a first positive number, or the drive signal increases till a voltage difference between the drive signal and the positive power supply is a first positive threshold, the power supply unit switching to a second positive working mode, wherein the positive power supply has a second positive voltage, the negative power supply has the first negative voltage;

if the power supply unit works in the second positive working mode, when the drive signal increases to a second positive number, or the drive signal increases till the voltage difference between the drive signal and the positive power supply is a fourth positive threshold, the power supply unit switching to a third positive working mode, wherein the positive power supply has a third positive voltage, the negative power supply has the first negative voltage; when the drive signal decreases, the drive signal of the power amplifying unit decreases to a second positive threshold, the power supply unit switching to a first positive sleep mode;

if the power supply unit works in a third positive working mode, when the drive signal of the power amplifying unit decreases to a fifth positive threshold, the power supply unit switching to a second positive sleep mode;

if the power supply unit works in the second positive sleep mode, when the positive power supply decreases to a sixth positive threshold, if the drive signal is smaller than the second positive threshold, the power supply unit switching to the first positive sleep mode; if the drive signal is larger than the second positive threshold, the power supply unit switching to the second positive working mode; and if the power supply unit works in the first positive sleep mode, when the positive power supply decreases to a third positive threshold, the power supply unit switching to the first working mode;

wherein the third positive voltage is larger than the second positive voltage, the second positive voltage is larger than the first positive voltage, the fifth positive threshold is larger than the second positive threshold, the sixth positive threshold is larger than the third positive threshold.

17. The method, as recited in claim 16, further comprising steps of:

if the power supply unit works in the first working mode, when the drive signal increases to a first negative number, or the drive signal increases till a voltage difference between the drive signal and the negative power supply is a first negative threshold, the power supply unit switching to a second negative working mode, wherein the negative power supply has a second negative voltage, the positive power supply has the first positive voltage;

if the power supply unit works in the second negative working mode, when the drive signal increases to a second negative number, or the drive signal increases till the voltage difference between the drive signal and the negative power supply is a fourth negative threshold, the power supply unit switching to a third negative working mode, wherein the negative power supply has a third negative voltage, the positive power supply has the first positive voltage; when the drive signal decreases, the drive signal of the power amplifying unit decreases to a second negative threshold, the power supply unit switching to a first negative sleep mode;

if the power supply unit works in the third negative working mode, when the drive signal of the power amplifying unit decreases to a fifth negative threshold, the power supply unit switching to a second negative sleep mode;

if the power supply unit works in the second negative sleep mode, when the negative power supply decreases to a sixth negative threshold, if the drive signal is smaller than the second negative threshold, the power supply unit switching to the first negative sleep mode; if the drive signal is larger than the second negative threshold, the power supply unit switching to the second negative working mode; and if the power supply unit works in the first negative sleep mode, when the negative power supply decreases to a third negative threshold, the power supply unit switching to the first working mode;

wherein the third negative voltage is larger than the second negative voltage, the second negative voltage is larger than the first negative voltage, the fifth negative threshold is larger than the second negative threshold, the sixth negative threshold is larger than the third negative threshold.

18. The method, as recited in claim 17, wherein: the power supply unit is able to work in an $N^{th}$ positive working mode and an $N^{th}$ negative working mode, here, $N \geq 3$;

if the power supply unit works in the $N^{th}$ positive working mode, the positive power supply and the negative power supply respectively have an $N^{th}$ positive voltage and the first negative voltage;

if the power supply unit works in the $N^{th}$ negative working mode, the positive power supply and the negative power supply respectively have the first positive voltage and an $N^{th}$ negative voltage;

the $N^{th}$ positive voltage is larger than a $(N-1)^{th}$ positive voltage, the $N^{th}$ negative voltage is larger than a $(N-1)^{th}$ negative voltage, here, N is an integer lager than three.

* * * * *